United States Patent
Stoff

(10) Patent No.: US 9,854,702 B2
(45) Date of Patent: Dec. 26, 2017

(54) COMPRESSED-AIR RACK FOR AN ELECTRIC LOCOMOTIVE

(71) Applicant: SIEMENS AKTIENGESELLSCHAFT, Munich (DE)

(72) Inventor: Helmut Stoff, Warngau (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/111,863

(22) PCT Filed: Jan. 15, 2014

(86) PCT No.: PCT/EP2014/050647
§ 371 (c)(1),
(2) Date: Jul. 15, 2016

(87) PCT Pub. No.: WO2015/106803
PCT Pub. Date: Jul. 23, 2015

(65) Prior Publication Data
US 2016/0345460 A1    Nov. 24, 2016

(51) Int. Cl.
*H05K 7/18* (2006.01)
*B61C 17/00* (2006.01)
(Continued)

(52) U.S. Cl.
CPC .............. *H05K 7/18* (2013.01); *B60T 13/665* (2013.01); *B60T 17/228* (2013.01); *B61C 3/00* (2013.01);
(Continued)

(58) Field of Classification Search
CPC ... H05K 7/18; H05K 7/14; H05K 5/03; B61C 3/00; B61C 17/00; B60T 17/228; B60T 13/665; H02G 3/081
(Continued)

(56) References Cited

U.S. PATENT DOCUMENTS 5,165,770 A * 11/1992 Hahn ................ A47B 47/05
                                                     211/26
6,561,602 B1 * 5/2003 Sevier ................ H02B 1/54
                                                     211/26
(Continued)

FOREIGN PATENT DOCUMENTS

CN    101945792 A    1/2011
CN    201769831 U    3/2011
(Continued)

*Primary Examiner* — Adrian S Wilson
*Assistant Examiner* — Abhishek Rathod
(74) *Attorney, Agent, or Firm* — Laurence A. Greenberg; Werner H. Stemer; Ralph E. Locher

(57) ABSTRACT

A compressed-air rack for an electric locomotive includes an electric assembly that is inserted between sheet metal walls of the compressed-air rack and is provided with electric modules which are accessible from the front. In order to be able to produce the electric assembly in a comparatively inexpensive manner and to mount the same with relative ease in the compressed air rack, the electric assembly includes a frame that has no rear wall and has open sides and reinforcing transverse members similar to a skeleton, and electric modules are mounted on the transverse members.

8 Claims, 5 Drawing Sheets

(51) Int. Cl.
  *B60T 13/66* (2006.01)
  *B60T 17/22* (2006.01)
  *B61C 3/00* (2006.01)
  *H05K 5/03* (2006.01)
  *H05K 7/14* (2006.01)
(52) U.S. Cl.
  CPC ............... *B61C 17/00* (2013.01); *H05K 5/03* (2013.01); *H05K 7/14* (2013.01)
(58) Field of Classification Search
  USPC ............................................ 361/641; 174/50
  See application file for complete search history.

(56) References Cited

U.S. PATENT DOCUMENTS

| | | | | |
|---|---|---|---|---|
| 6,826,036 | B2* | 11/2004 | Pereira | G06F 1/189 361/624 |
| 7,113,762 | B1* | 9/2006 | Hertz | H05K 7/1488 361/600 |
| 8,424,691 | B2* | 4/2013 | McMillan, III | H05K 7/186 174/50 |
| 8,869,951 | B2 | 10/2014 | Stoff | |
| 2004/0016713 | A1* | 1/2004 | Wyatt | A47B 96/1408 211/183 |
| 2006/0043031 | A1* | 3/2006 | Rinderer | H05K 7/186 211/26 |
| 2011/0031073 | A1 | 2/2011 | Stoff | |
| 2012/0026648 | A1* | 2/2012 | Schneider | H02B 1/32 361/622 |

FOREIGN PATENT DOCUMENTS

| | | |
|---|---|---|
| CN | 202320375 U | 7/2012 |
| CN | 103280696 A | 9/2013 |
| DE | 102008009217 A1 | 8/2009 |

* cited by examiner

COMPRESSED-AIR RACK FOR AN ELECTRIC LOCOMOTIVE

BACKGROUND OF THE INVENTION

Field of the Invention

The invention relates to a compressed-air rack for an electric locomotive with an electric assembly that is inserted between sheet metal walls of the compressed-air rack and has electric modules which are accessible from the front. An electric locomotive is understood here to mean both a fully electrically operated locomotive and also a diesel-electric locomotive.

A compressed-air rack of this type is used in electric and diesel-electric locomotives from Siemens AG. These compressed-air racks comprise, in tightly packed form, what are known as the pneumatic braking chart, a compressor, a dryer, a filter, a tank for main air and auxiliary air as well as further ancillary devices and also an electric assembly for control purposes. The electric assembly is embodied here as an electronics cabinet, which is fitted with the requisite electric modules. The ready-fitted electronics cabinet is accommodated in the compressed-air rack which is embodied so that it can receive the forces resulting from the weight of the electronics cabinet. The electronics cabinet is mounted here on a base plate of the compressed-air rack. The electronics cabinet is further supported above by a rear wall of the compressed-air rack.

BRIEF SUMMARY OF THE INVENTION

The object underlying the invention is to propose a compressed-air rack which can be produced in a comparably inexpensive manner in terms of its electric assembly and in which the electric assembly can be installed relatively easily.

To achieve this object, with a compressed-air rack of the type specified in the introduction, in accordance with the invention the electric assembly has a frame which is embodied with no rear wall and with open sides and with reinforcing transverse members similar to a skeleton. Electric modules are attached to the transverse members.

One major advantage of the inventive compressed-air rack consists, in respect of its electric assembly, in it substantially managing with a device holder in the form of a frame similar to a skeleton. After mounting, the lateral and rearward termination of the frame is formed by side walls or lateral members and the rear wall of the receiving rack which are already required for structural reasons. When the frame of the inventive compressed-air rack is fitted with components, a further advantage consists in a good accessibility being ensured because it is possible to engage in the frame both conventionally from the front side and also here additionally from the side and rear. In this way the reinforcing transverse members barely hinder the mounting of the electric modules.

These advantages then result in particular if, according to an advantageous development of the inventive compressed-air rack, the transverse members rest on the front side of the frame.

The frame of the electric assembly of the inventive compressed-air rack can be produced in different ways, for instance from several single parts, which are screwed or riveted to one another. For cost reasons, it is however already particularly advantageous for the frame to be a single-piece flexible sheet metal part, because additional connecting steps are then not needed to produce the frame.

To reinforce the frame of the electric assembly of the inventive compressed-air rack, it is advantageous if the transverse members support the rear of U-shaped mounting plates, which are connected to a longitudinal member, and the longitudinal member is connected above and below to the rear of the frame.

In a further advantageous embodiment of the inventive compressed-air rack, the side walls of the frame are provided with recesses for receiving electric modules. In this context, it is noted that within the scope of the invention it is also possible to attach electric modules to the side walls of the frame and this is facilitated by the open construction of the frame.

It is also advantageous if sealing side plates are attached to the front side of the frame, as a result of which the frame of the electric assembly of the inventive compressed-air rack experiences the quality, in respect of a sealing, such as can otherwise only be achieved with complex cabinets.

With the inventive compressed-air rack, stops for supporting a front door are advantageously attached to a side plate.

It is also considered to be advantageous if a reinforcing cover is fitted to the frame.

The frame of the electric assembly of the inventive compressed-air rack can be connected to the compressed-air rack in different ways. It is considered to be advantageous if the frame is screwed to the compressed-air rack.

The inventive compressed-air rack particularly advantageously enables the electric assembly with its frame to be directly inserted between the sheet metal walls of the compressed-air rack by forming a module unit which is enclosed on all sides.

BRIEF DESCRIPTION OF THE SEVERAL VIEWS OF THE DRAWING

An arrangement which can be compared with a conventional electronics cabinet is thus formed without additional side walls and a rear wall.

To further explain the invention

DESCRIPTION OF THE INVENTION

Figure 1:
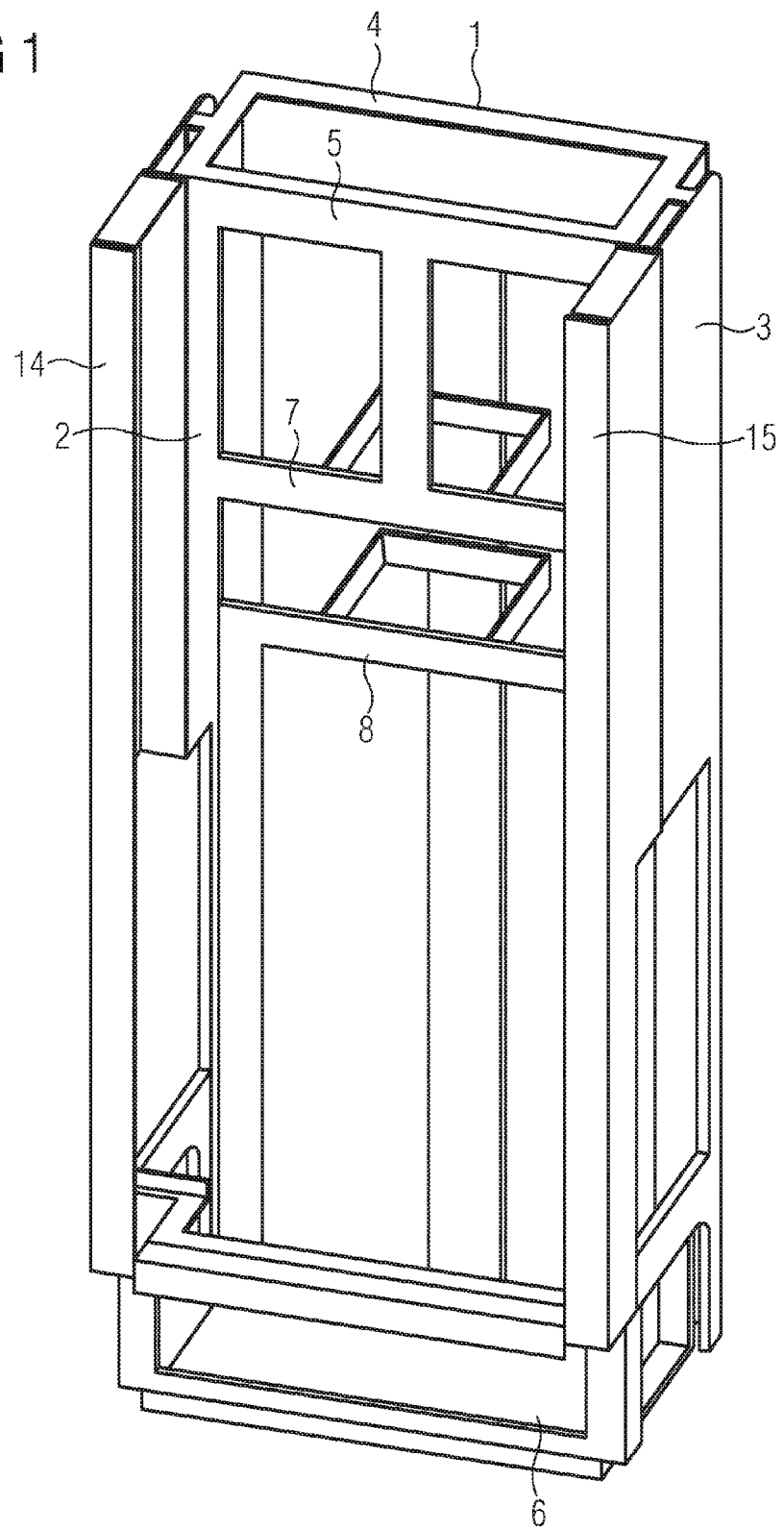
FIG. 1 shows an oblique view laterally from the front of an exemplary embodiment of a frame of the electric assembly of a compressed-air rack with fixed side walls
Figure 2:
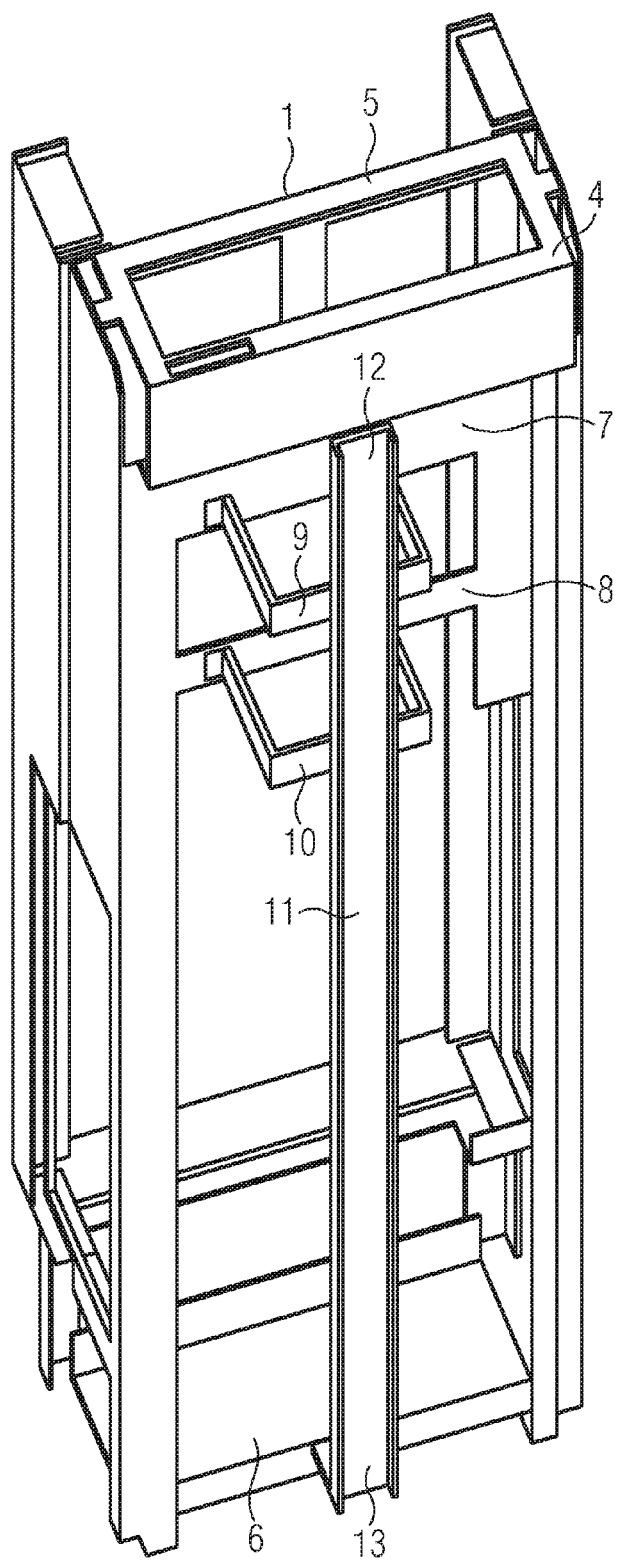
FIG. 2 shows a rear view of the same exemplary embodiment according to FIG. 1 obliquely from the rear.

FIGS. 1 and 2 show a frame 1 of an electric assembly, otherwise not shown in further detail here, of a compressed-air rack which is likewise not reproduced here. The frame 1 is embodied similar to a skeleton, by it having neither a front side nor a rear side, but only open side walls 2 and 3, which are connected to one another on the topside of the frame 1 by means of upper connecting sheets 4 and 5 and below by means of a base plate 6. The frame 1 further comprises a transverse member 7 and a further transverse member 8, which connect the side walls 2 and 3 to one another in a reinforcing manner on the front side of the frame 1 in each case.

As can be seen in particular in FIG. 2, U-shaped mounting plates 9 and 10 are fastened to the transverse member 7 and to the further transverse member 8. A longitudinal member 11 is connected to these mounting plates 9 and 10, which, at its upper end 12, is connected to the upper connecting sheet 4 and at its lower end 13 in the region of the base plate 6 is connected to the frame 1.

As shown above all in FIG. 1, a side plate 14 and a further side plate 15 are attached to the front side of the frame 1, said side plates being connected in a sealing manner (not shown) to the side walls 2 and 3 of the frame 1.

Figure 3:
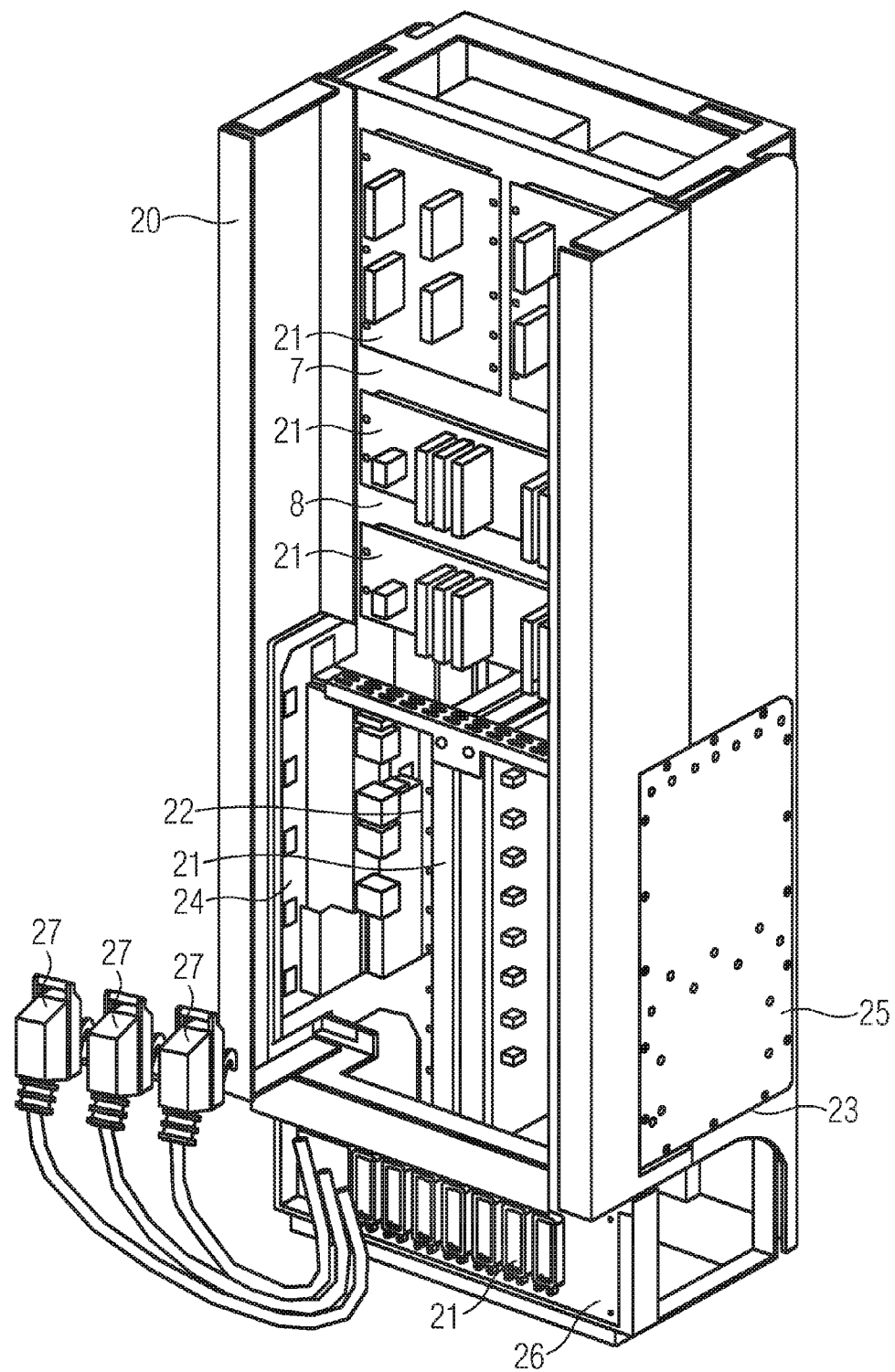
FIG. 3 shows the same exemplary embodiment of a bogie truck with electric modules already mounted.

FIG. 3 shows the almost completely finished electric assembly 20 with electric modules 21, such as are also used in cabinet designs of electric assemblies. It is also apparent here that these electric modules are not only fastened to the transverse members 7 and 8 but are instead also introduced into recesses 22 and 23 in the form of further electric modules 24 and 25. FIG. 3 further shows that additional electric modules 26 are accommodated in a lower region of the electric assembly 20. It is likewise apparent that wires are routed from the electric assembly 20 to external connection elements 27.

Figure 4:
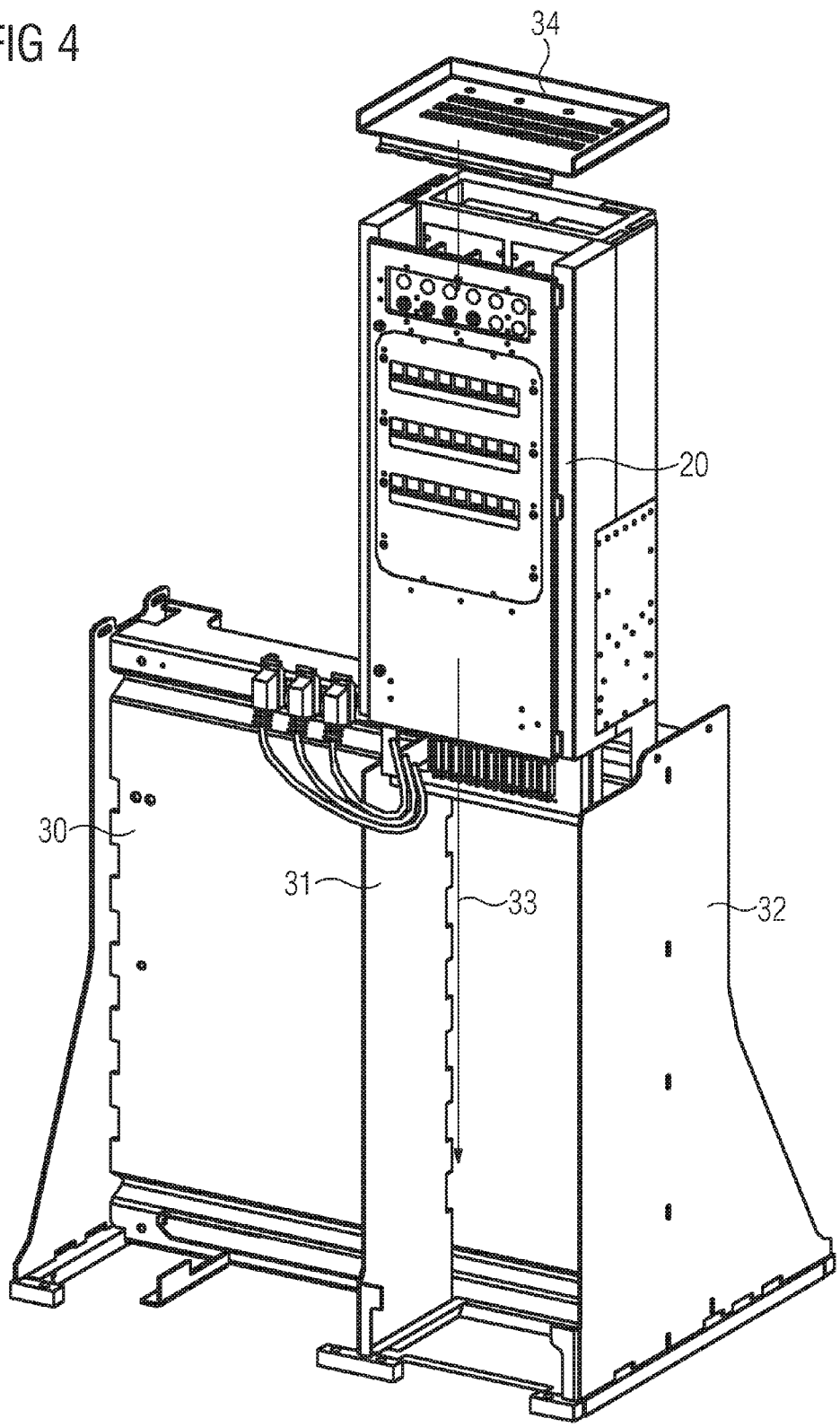
FIG. 4 shows the same exemplary embodiment upon introduction into a compressed-air rack with a fixed cover and FIG. 5 shows the compressed-air rack with an introduced electric assembly.

FIG. 4 shows a compressed-air rack 30, such as can be used within the scope of the invention. It is apparent that the compressed-air rack has sheet metal walls 31 and 32, which form a receiving space for the electric assembly 20. It is indicated in the state shown, how, precisely, the electric assembly 20 is inserted in the direction of the arrow 33 between the sheet metal walls 31 and 32 into the compressed-air rack 30, wherein an additional reinforcement and termination of the electric assembly 20 is effected by means of a cover 34 in the fixed state.

Figure 5:
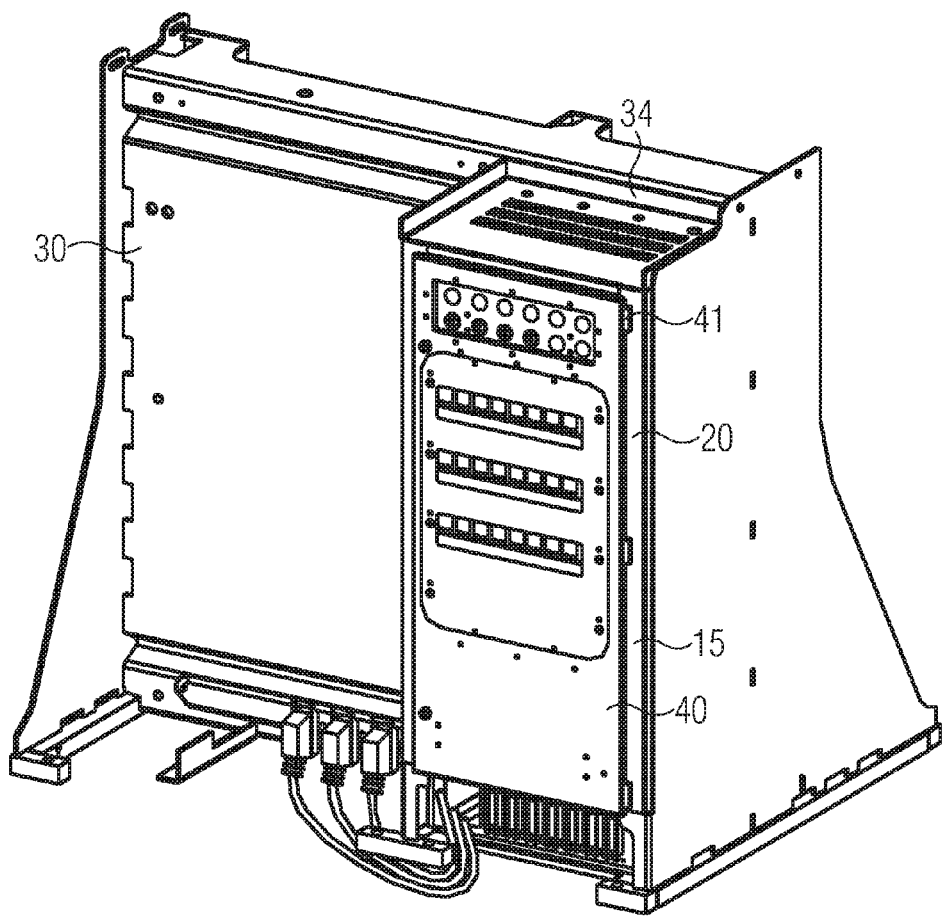

FIG. 5 finally shows the electric assembly 20 in a state integrated into the compressed-air rack with a door 40, which abuts a side plate 15 by means of stops 41. The cover 34 is in the fixed state here.

The invention claimed is:

1. A compressed-air rack of an electric locomotive, the compressed-air rack comprising:
   sheet metal rack walls; and
   an electric assembly inserted between said sheet metal rack walls;
   said electric assembly having a frame with a front, a rear, no rear wall, open sides and reinforcing transverse members in a skeleton structure, said transverse members resting on said front of said frame and said transverse member having a rear;
   said electric assembly having electric modules accessible from said front and electric modules attached to said transverse members;
   U-shaped mounting plates supported on said rear of said transverse members; and
   a longitudinal member connected to said U-shaped mounting plates and connected above and below to said rear of said frame.

2. The compressed-air rack according to claim 1, wherein said frame is a single-piece, flexible sheet metal part.

3. The compressed-air rack according to claim 1, wherein said frame has side walls with recesses formed therein for receiving said electric modules.

4. The compressed-air rack according to claim 1, which further comprises sealing side plates attached to said front of said frame.

5. The compressed-air rack according to claim 4, which further comprises stops attached to one of said side plates, and a front door supported by said stops.

6. The compressed-air rack according to claim 1, which further comprises a reinforcing cover fitted to said frame.

7. The compressed-air rack according to claim 1, wherein said frame is screwed into the compressed-air rack.

8. The compressed-air rack according to claim 1, wherein said frame of said electric assembly is inserted directly between said sheet metal rack walls to form a module being enclosed on all sides.

* * * * *